US012585199B2

(12) United States Patent
Jung et al.

(10) Patent No.: US 12,585,199 B2
(45) Date of Patent: Mar. 24, 2026

(54) OVERLAY CORRECTION METHOD, AND EXPOSURE METHOD AND SEMICONDUCTOR DEVICE MANUFACTURING METHOD INCLUDING OVERLAY CORRECTION METHOD

(71) Applicant: Samsung Electronics Co., Ltd., Suwon-si (KR)

(72) Inventors: Wooyong Jung, Suwon-si (KR); Dohun Kim, Suwon-si (KR); Joonhyun Kim, Suwon-si (KR); Jeongjin Lee, Suwon-si (KR); Seungyoon Lee, Suwon-si (KR); Chan Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 243 days.

(21) Appl. No.: 18/347,129

(22) Filed: Jul. 5, 2023

(65) Prior Publication Data

US 2024/0160115 A1 May 16, 2024

(30) Foreign Application Priority Data

Nov. 11, 2022 (KR) ........................ 10-2022-0150984

(51) Int. Cl.
*G03F 7/00* (2006.01)
*H01L 21/027* (2006.01)

(52) U.S. Cl.
CPC .... *G03F 7/70633* (2013.01); *G03F 7/706839* (2023.05); *H01L 21/027* (2013.01)

(58) Field of Classification Search
CPC ........... G03F 7/70633; G03F 7/706839; G03F 7/2004; G03F 7/70433; G03F 7/70783; G03F 7/7085; G03F 9/7003; G03F 9/7034; H01L 21/027
See application file for complete search history.

(56) References Cited

U.S. PATENT DOCUMENTS

| | | | |
|---|---|---|---|
| 8,058,683 B2 | 11/2011 | Yoon et al. | |
| 9,053,284 B2 * | 6/2015 | Chang ................... | G06F 30/398 |
| 10,466,596 B2 | 11/2019 | Pierson et al. | |
| 10,509,329 B2 | 12/2019 | Veeraraghavan et al. | |
| 10,866,524 B2 | 12/2020 | Chang et al. | |

(Continued)

FOREIGN PATENT DOCUMENTS

| | | |
|---|---|---|
| KR | 101398494 B1 | 5/2014 |
| WO | WO-2021-032398 A1 | 2/2021 |

*Primary Examiner* — Deoram Persaud
(74) *Attorney, Agent, or Firm* — Harness, Dickey & Pierce, P.L.C.

(57) ABSTRACT
Provided are an overlay correction method for effectively correcting an overlay due to degradation of a wafer table, and an exposure method and a semiconductor device manufacturing method, which include the overlay correction method, wherein the overlay correction method includes acquiring leveling data regarding a wafer, converting the leveling data into overlay data, splitting a shot into sub-shots via shot size split, extracting a model for each sub-shot from the overlay data, and correcting an overlay parameter of exposure equipment on the basis of the model for each sub-shot, wherein the correction of the overlay parameter is applied in real time to an exposure process for the wafer in a feedforward method.

20 Claims, 19 Drawing Sheets

(56)     References Cited

U.S. PATENT DOCUMENTS

| | | | |
|---|---|---|---|
| 10,996,176 B2 | 5/2021 | Elings et al. | |
| 2013/0090877 A1* | 4/2013 | Nagai | G03F 7/70633 |
| | | | 702/95 |
| 2016/0334712 A1* | 11/2016 | Cekli | G03F 7/70141 |
| 2020/0201191 A1 | 6/2020 | Rahman et al. | |
| 2021/0199596 A1* | 7/2021 | Asano | G03F 7/70633 |
| 2022/0244649 A1* | 8/2022 | Smorenberg | G03F 7/705 |
| 2024/0152046 A1* | 5/2024 | Lee | G03F 7/70558 |
| 2025/0028254 A1* | 1/2025 | Zhang | G03F 7/70783 |

* cited by examiner

OVERLAY CORRECTION METHOD, AND EXPOSURE METHOD AND SEMICONDUCTOR DEVICE MANUFACTURING METHOD INCLUDING OVERLAY CORRECTION METHOD

CROSS-REFERENCE TO RELATED APPLICATION

This application is based on and claims priority under 35 U.S.C. § 119 to Korean Patent Application No. 10-2022-0150984, filed on Nov. 11, 2022, in the Korean Intellectual Property Office, the disclosure of which is incorporated by reference herein in its entirety.

BACKGROUND

The inventive concepts relate to an overlay correction method, and more particularly, to an overlay correction method for correcting an overlay due to a wafer table, and an exposure method and a semiconductor device manufacturing method, which include the overlay correction method.

Recently, as the line widths of semiconductor circuits gradually become finer, light sources having shorter wavelengths are implemented during production. For example, extreme ultra-violet (EUV) light has been used as exposure light sources. Due to the absorption characteristics of EUV light, reflective EUV masks are generally used in EUV exposure processes. In addition, illumination optics for transmitting EUV light to EUV masks and projection optics for projecting EUV light reflected from the EUV masks onto exposure targets may include a plurality of mirrors. Meanwhile, as patterns become finer, overlay errors due to various causes have occurred in EUV exposure processes.

SUMMARY

The inventive concepts provide an overlay correction method of effectively correcting an overlay due to degradation of a wafer table, and an exposure method and a semiconductor device manufacturing method including the overlay correction method.

In addition, the objects to be achieved by the inventive concepts are not limited to the above-mentioned objects, and other objects may be clearly understood by one of ordinary skill in the art from the following description.

According to an aspect of the inventive concepts, there is provided an overlay correction method including acquiring leveling data of a wafer; converting the leveling data into overlay data; splitting a shot of the wafer into sub-shots via a shot size split; extracting a model for each sub-shot from the overlay data; and correcting an overlay parameter of exposure equipment based on the model for each sub-shot, wherein the correcting of the overlay parameter is applied in real time.

According to another aspect of the inventive concepts, there is provided an exposure method including acquiring first leveling data of a first wafer, converting the first leveling data into overlay data, splitting a shot of the first wafer into sub-shots via a shot size split, extracting a model for each sub-shot from the overlay data, correcting an overlay parameter of exposure equipment based on the model for each sub-shot, and performing an exposure process on the first wafer using the exposure equipment adjusted based on the corrected overlay parameter.

According to another aspect of the inventive concepts, there is provided a semiconductor device manufacturing method including acquiring leveling data of at least one of a plurality of wafers; converting the leveling data into overlay data; splitting a shot of the at least one wafer into sub-shots via a shot size split; extracting a model for each sub-shot from the overlay data; correcting an overlay parameter of exposure equipment on based on the model for each sub-shot; performing an exposure process on the at least one wafer using the exposure equipment adjusted based on the corrected overlay parameter; patterning the exposed wafer; and performing a subsequent semiconductor process on the patterned wafer, wherein the exposure process is performed by correcting the overlay parameter for each of the plurality of wafers and each sub-shot in real time.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
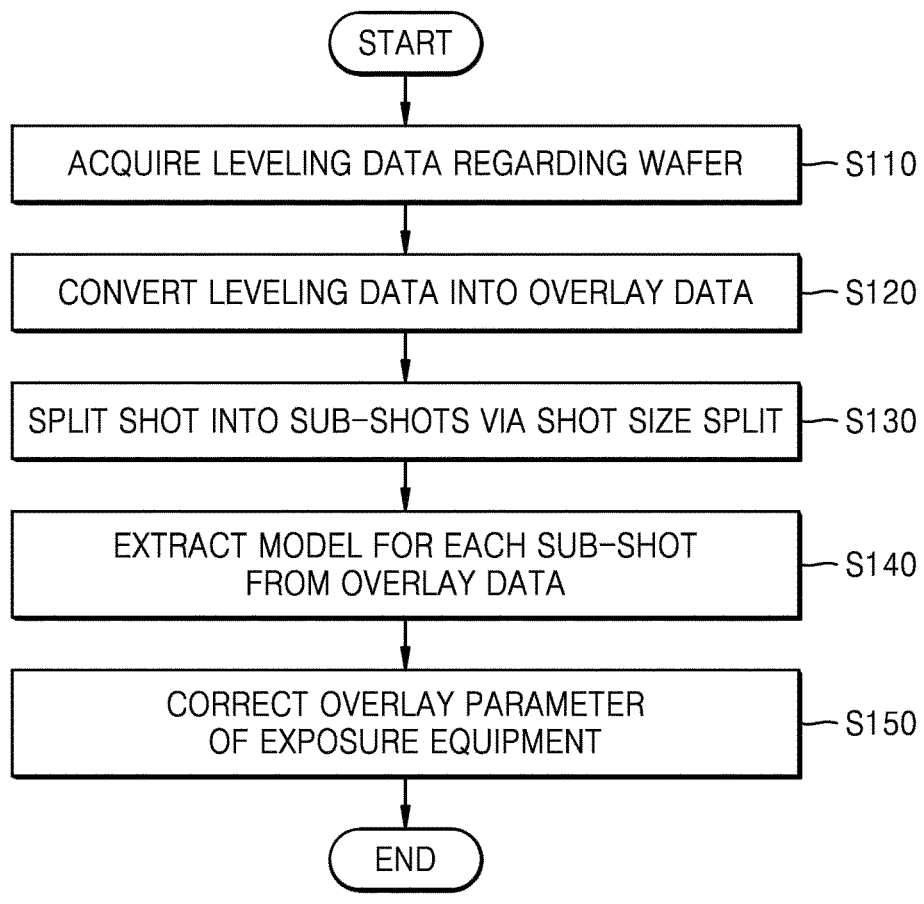
FIG. 1 is a flowchart schematically illustrating a process of an overlay correction method according to at least one embodiment.

Hereinafter, embodiments will be described in detail with reference to the accompanying drawings. The same reference numerals are used for the same components in the drawings, and the same descriptions thereof will be omitted. When the terms "about" or "substantially" are used in this specification in connection with a numerical value and/or geometric terms, it is intended that the associated numerical value includes a manufacturing tolerance (e.g., ±10%) around the stated numerical value. Further, regardless of whether numerical values and/or geometric terms are modified as "about" or "substantially," it will be understood that these values should be construed as including a manufacturing or operational tolerance (e.g., ±10%) around the stated numerical values and/or geometric. When referring to "C to D", this means C inclusive to D inclusive unless otherwise specified.

Figure 2:
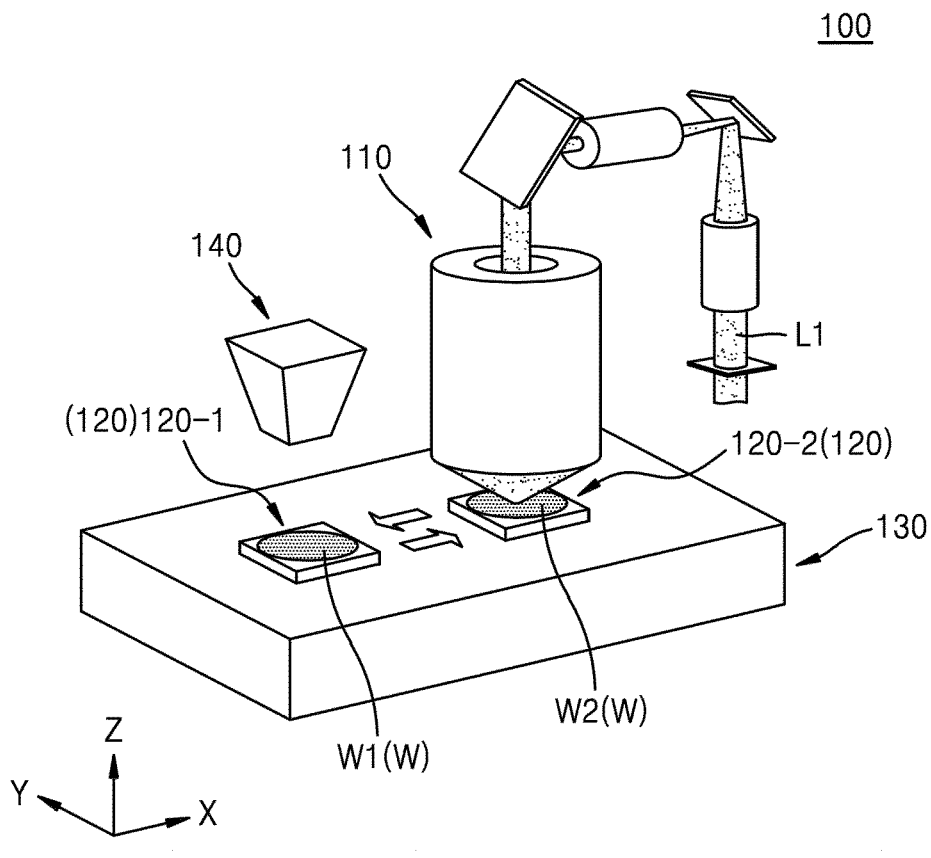
FIG. 2 is a conceptual diagram schematically illustrating extreme ultra-violet (EUV) exposure equipment, in relation to the overlay correction method of FIG. 1.

FIG. 1 is a flowchart schematically illustrating a process of an overlay correction method according to at least one embodiment, and FIG. 2 is a conceptual diagram schematically illustrating extreme ultra-violet (EUV) exposure equipment, in relation to the overlay correction method of FIG. 1.

Referring to FIGS. 1 and 2, in the overlay correction method of at least one example, in operation S110, leveling data regarding a wafer is acquired. Here, the leveling data may refer to data regarding a height of a top surface of a wafer W in a vertical direction, i.e., a Z direction. The overlay correction method of the present example may correspond to, for example, an overlay correction method in an EUV exposure process. However, the overlay correction method of the present example is not limited to the EUV exposure process.

In the overlay correction method of the present example, the EUV exposure process may be performed via EUV exposure equipment 100 as illustrated in FIG. 2. The EUV exposure equipment 100 may include an EUV optical system 110, a wafer table 120, a table support body 130, and a measurement apparatus 140.

The EUV optical system 110 may include an EUV light source, a first optical system, a second optical system, an EUV mask, and a mask stage. The EUV light source is configured to generate and output EUV light L1 having a high energy density within a wavelength range of about 5 nm to about 50 nm. For example, the EUV light source may generate and output the EUV light L1 having a high energy density of 13.5 nm wavelength. The EUV light source may be a plasma-based light source or a synchrotron radiation light source. Here, the plasma-based light source may refer to a light source that generates plasma and uses light emitted by the plasma, and may include a laser-produced plasma (LPP) light source, a discharge-produced plasma (DPP) light source, and/or the like. In the EUV optical system 110 of the EUV exposure equipment 100 of FIG. 2, the EUV light source may be, for example, a plasma-based light source. However, the EUV light source is not limited to the plasma-based light source. In at least some embodiments, the plasma-based light source may include a condensing mirror (such as an elliptical mirror and/or a spherical mirror for concentrating EUV light) to increase an energy density of illumination light incident on the first optical system.

The first optical system may transfer, to the EUV mask, the EUV light L1 from the EUV light source. The first optical system may include a plurality of mirrors. For example, the first optical system may include two or three mirrors. However, the number of mirrors in the first optical system is not limited to two or three. Meanwhile, the first optical system may make the EUV light L1 into a curved slit shape and allow the EUV light L1 having the curved slit shape to be incident on the EUV mask. Here, the curved slit shape of the EUV light L1 may refer to a parabolic two-dimensional curve on an x-y plane.

The EUV mask may be a reflective mask having a reflective region and a non-reflective and/or intermediate reflective region. The EUV mask may include a substrate, a reflective multilayer film on the substrate, and an absorption layer pattern on the reflective multilayer film. The EUV mask substrate may be formed of a low thermal expansion coefficient material (LTEM), such as quartz. The reflective multilayer film may be formed on the EUV mask substrate and may reflect EUV light. The reflective multilayer film may have, for example, a structure in which a molybdenum (Mo) film and a silicon (Si) film are alternately stacked in several tens or more of layers. However, the materials constituting the reflective multilayer film are not limited to Mo and Si. The absorption layer pattern may be formed on the reflective multilayer film, and may absorb EUV light. The absorption layer pattern may be formed of, for example, at least one of TaN, TaNO, TaBO, Ni, Au, Ag, C, Te, Pt, Pd, Cr, and/or the like. However, the material of the absorption layer pattern is not limited to the materials described above. Here, the absorption layer pattern may constitute the non-reflective and/or intermediate reflective region described above.

The EUV mask may reflect the EUV light L1 incident through the first optical system and allow the reflected EUV light L1 to be incident on the second optical system. For example, the EUV mask is configured to reflect the EUV light L1 incident from the first optical system (e.g., may structuralize the EUV light L1 according to shapes of the reflective multilayer film on the EUV mask substrate and the absorption layer pattern) and allow the structuralized EUV light L1 to be incident on the second optical system. The structuralized EUV light L1 may be incident on the second optical system while holding information in the form of a pattern on the EUV mask, transmitted through the second optical system, and irradiated onto a top upper surface of the wafer W to be exposed. In detail, the structuralized EUV light L1 may be irradiated onto a photoresist (PR) layer on the wafer W through the second optical system.

The second optical system may include a plurality of mirrors. For example, the second optical system may include four to eight mirrors. However, the number of mirrors in the second optical system is not limited to four to eight. As described above, the second optical system may transfer the EUV light L1 reflected from the EUV mask to the wafer W through reflection by mirrors.

The EUV mask may be disposed on the mask stage. The mask stage is configured to move in an X direction and a Y direction on the X-Y plane, and to move in a Z direction perpendicular to the X-Y plane. In addition, the mask stage may rotate on the X-Y plane on the basis of a Z axis, or may rotate on a Y-Z plane or an X-Z plane on the basis of an X axis or a Y axis. Due to the movement of the mask stage, the EUV mask may move in the X direction, the Y direction, or the Z direction, and may also rotate on the basis of the X axis, the Y axis, or the Z axis. For example, the mask stage may include or be attached to actuators, like pistons, pivots, motors, etc.

The wafer table 120 is configured such that the wafer W may be disposed on the wafer table 120. The wafer table 120 may move in the X direction and the Y direction on the X-Y plane, and may move in the Z direction perpendicular to the X-Y plane. In addition, the wafer table 120 may rotate on the X-Y plane on the basis of the Z axis, or may rotate on the Y-Z plane or the X-Z plane on the basis of the X axis or the Y axis. Due to the movement of the wafer table 120, the wafer W may move in the X direction, the Y direction, or the Z direction, and may also rotate on the basis of the X axis, the Y axis, or the Z axis. For example, the wafer stage 120 may include or be attached to actuators, like pistons, pivots, motors, etc.

The table support body 130 is configured to support the wafer table 120. As illustrated in the EUV exposure equipment 100 of FIG. 2, two wafer tables 120 may be disposed on the table support body 130. For example, the wafer table 120 may include at least a first wafer table 120-1 and a second wafer table 120-2.

The measurement apparatus 140 is configured to measure a level of the wafer W disposed on the first wafer table 120-1. As described above, the level measurement may refer to measuring a height of the top surface of the wafer W in the Z direction. Leveling data regarding the wafer W may be acquired via the level measurement through the measurement apparatus 140 described above.

Meanwhile, positions of the first wafer table 120-1 and the second wafer table 120-2 may be swapped with each other on the table support body 130. For example, in the EUV exposure equipment 100, leveling data of a first wafer W1 may be acquired by measuring, via the measurement apparatus 140, a level of the first wafer W1 disposed on the first wafer table 120-1. In addition, an EUV exposure process through the EUV optical system 110 may be performed on a second wafer W2 disposed on the second wafer table 120-2. In at least one embodiment, the measurement apparatus 140 and the EUV optical system 110 may operate at the same time.

After the exposure process for the second wafer W2, the second wafer W2 may be unloaded and taken out from the second wafer table 120-2, and the positions of the first wafer table 120-1 and the second wafer table 120-2 may be swapped with each other. For example, the first wafer table 120-1 may move to a position at which the EUV optical system 110 is arranged, and/or the second wafer table 120-2 may move to a position at which the measurement apparatus 140 is arranged. Subsequently, a new third wafer may be loaded on the second wafer table 120-2, and level measurement may be performed via the measurement apparatus 140 to acquire leveling data regarding the third wafer. In addition, an EUV exposure process may be performed, through the EUV optical system 110, on the first wafer W disposed on the first wafer table 120-1. The above process may be continuously performed on wafers included in one lot. Here, one lot may include, for example, twenty-four (24) wafers W. However, the number of wafers W included in one lot is not limited to 24.

The measurement apparatus 140 may measure not only the level of the wafer W but also a critical dimension (CD) or an overlay of patterns on the wafer W. The measurement apparatus 140 may include an optical microscope, or an electron microscope, such as a scanning electron microscope (SEM) or a transmission electron microscope (TEM). In addition, the measurement apparatus 140 may use, as a measurement method, an ellipsometry, such as imaging ellipsometry (IE), spectroscopic imaging ellipsometry (SIE), and/or the like. The measurement method of the measurement apparatus 140 is not limited to the ellipsometry and/or electron microscopy. For example, the measurement method may include computer vision techniques (such as photometric stereo imaging and/or the like) and/or the like. According to at least one embodiment, the measurement apparatus 140 may be implemented as a separate apparatus from the EUV exposure equipment 100. Meanwhile, measurement of a CD or overlay for patterns on a wafer via the measurement apparatus 140 may be performed by using after development inspection (ADI) and after cleaning inspection (ACI).

For reference, an overlay refers to a difference in an overlap between a previous layer corresponding to a under layer and a current layer corresponding to an upper layer, and is also referred to as an overlay error. Hereinafter, the difference in the overlap, or the overlay error is commonly referred to as an overlay. In general, the overlay is minimized by performing a shot to maximally match the under layer on the basis of an overlay mark of the under layer and/or the like during an exposure process for the upper layer.

Meanwhile, the overlays may be calculated by measuring a first overlay mark formed on the under layer and a second overlay mark formed on the upper layer, and calculating a relative difference between the positions thereof. The first overlay mark may be formed together when a pattern is formed on the under layer, and the second overlay mark may be formed together when a pattern is formed on the upper layer. The overlay mark may be formed in a box pattern shape or a bar pattern shape, and may be formed on a scribe lane of a wafer and/or the like. However, the shape or position of the overlay mark is not limited to the above description.

When the overlay is great (e.g., when the relative position difference between the under layer and the current layer is great) performance of a semiconductor device may be adversely affected. Accordingly, in an exposure process, overlay correction may be performed. The overlay correction may be performed via correction of overlay parameters. The parameters of the overlay may refer to parameters related to an overlay between layers on the wafer W to be exposed.

For example, when an overlay in the X direction is dx and an overlay in the Y direction is dy, overlay parameters K1 to K6, which are first order parameters, appear as in dx=k1, dy=k2, dx=k3*x, dy=k4*y, dx=k5*y, and dy=k6*x. Also, overlay parameters K7 to K12, which are second order parameters, appear as in $dx=k7*x^2$, $dy=k8*y^2$, $dx=k9*x*y$, $dy=k10*y*x$, $dx=k11*y^2$, and $dy=k12*x^2$. In addition, overlay parameters K13 to K20, which are third order parameters, appear as in $k13*x^3$, $dy=k14*y^3$, $dx=k15*x^2*y$, $dy=k16*y^2*x$, $dx=k17*x*y^2$, $dy=k18*y*x^2$, $dx=k19*y^3$, and $dy=1(20*x^3$. The first order parameters and the second order parameters may also be referred to as positional and angular parameters, and may be corrected by physical operations.

For reference, in a deep ultra-violet (DUV) exposure apparatus, e.g., an ArFi exposure apparatus, all overlay parameters may be corrected by a physical operation. Meanwhile, even in an EUV exposure apparatus, most overlay parameters may also be corrected via a physical operation, similarly to the ArFi exposure apparatus. However, in the EUV exposure apparatus, the overlay parameter K13-K20 is classified almost not to be corrected via a physical operation due to a hardware difference between the EUV exposure apparatus and the ArFi exposure apparatus.

After acquiring the leveling data, in operation S120, the leveling data is converted into overlay data. Here, the overlay data is data that is obtained via calculation and conversion on the basis of the leveling data, rather than data regarding an actual overlay. For example, the overlay data may be obtained from the leveling data by obtaining an in-plane distortion (IPD) value from the leveling data and converting the IPD value into overlay data by applying a weight to the IPD value. The process of converting the leveling data into the overlay data will be described below in more detail with reference to FIG. 7.

After converting the leveling data into the overlay data, in operation S130, one shot is split into several sub-shots via shot size split. Here, the shot may correspond to an exposure process of transferring an EUV mask via a single scan operation, or a region on a wafer corresponding thereto. A sub-shot refers to one of several regions into which one shot is split, and all sub-shots may have substantially the same size. The split into the sub-shots may be performed to more faithfully reflect a state of a top surface of a wafer table in a subsequent model extraction process. For example, when a model is extracted for the entire shot and an overlay is corrected, a state of a top surface of a wafer table may not be faithfully reflected, and accordingly, the overlay due to degradation of the top surface of the wafer table may not be accurately corrected.

After splitting into the sub-shots via the shot size split, in operation S140, a model for each sub-shot is extracted from the overlay data. Here, a model and/or a model value may indicate that an overlay is reconstructed into a correctable overlay parameter. For example, a measured overlay may not be accurately and completely corrected, and thus, a correctable approximate value may be extracted as an overlay parameter from the measured overlay. The process of extracting the correctable overlay parameter is referred to as an overlay modeling process. In the overlay correction method of the present example, overlay modeling may be performed via polynomial regression modeling.

In the overlay correction method of the present example, a model is not extracted for the one entire shot, but one shot is split into several sub-shots, and then a model is extracted for each of the sub-shots. As described above, by extracting the model for each sub-shot, time-series degradation of the top surface of the wafer table may be more accurately reflected in overlay parameters. The process of extracting the model for each sub-shot will be described in more detail with reference to FIGS. 8A to 8D. In addition, the time-series degradation of the top surface of the wafer table and the resultant overlay degradation will be described in more detail with reference to FIGS. 3 to 6.

After extracting the model for each sub-shot from the overlay data, in operation S150, an overlay parameter of exposure equipment is corrected on the basis of the model for each sub-shot. Here, the exposure equipment may be, for example, the EUV exposure equipment 100 of FIG. 2. However, in the overlay correction method of the present example, the exposure equipment is not limited to the EUV exposure equipment.

In the overlay correction method of the present example, the correction of the overlay parameter of the exposure equipment may be performed for each wafer and each sub-shot in a feedforward method in real time. For example, in the overlay correction method of the present example, when an exposure process is performed on one lot, correction of an overlay parameter may be performed in real time on each of the wafers of the one lot. In addition, with respect to one wafer, correction of an overlay parameter may be performed in real time for each sub-shot. For example, the correction method may include compensating for the damage to the surface of the wafer table 120 by tilting, rotating, positioning, etc. the wafer table 120 based on a result of the polynomial regression modeling. In at least some embodiments, the wafer table 120 may be rotated and/or repositioned to reduce the degradation discussed in further detail below from accumulating in a location of the wafer table 120.

Meanwhile, the feedforward method may refer to a method of performing an exposure process on the first wafer W1 by applying, in real time to the exposure equipment, the overlay parameter obtained on the basis of the leveling data regarding the first wafer W1. In more detail, with respect to the first wafer table 120-1, leveling data regarding the first wafer W1 may be acquired, the leveling data may be converted into overlay data, and a model for each sub-shot may be extracted from the overlay data. Subsequently, on the basis of the model for each sub-shot, overlay parameters of the exposure equipment may be corrected, and an exposure process for the first wafer W1 may be performed by using the exposure equipment having the corrected overlay parameters.

The overlay correction method of the present example may effectively correct an overlay due to time-series degradation of a top surface of a wafer table by correcting an overlay parameter of exposure equipment on the basis of leveling data regarding a wafer. Also, the overlay due to the degradation of the top surface of the wafer table may be more accurately corrected by splitting one shot into several sub-shots and extracting a model for each of the sub-shots to correct an overlay parameter. In addition, the overlay correction method of the present example may significantly reduce a performance time of the exposure process by adopting a feedforward method of correcting, in real time on the basis of leveling data regarding a wafer, an overlay parameter of exposure equipment exposing the corresponding wafer. Accordingly, the overlay correction method of the present example may perform overlay correction for each wafer and each sub-shot on the basis of the feedforward method, and may correct an overlay due to time-series degradation of the top surface of the wafer table in an exposure process for all wafers.

Figure 3A:
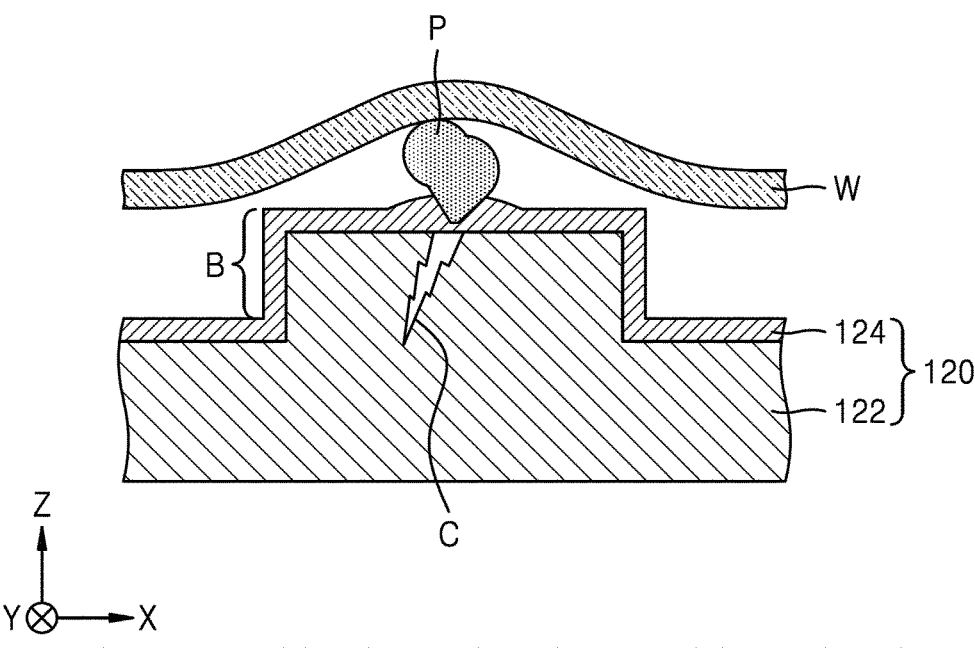
FIGS. 3A and 3B are a partial cross-sectional view of a wafer table and photographs corresponding thereto, for illustrating degradation of the wafer table.
Figure 3B:
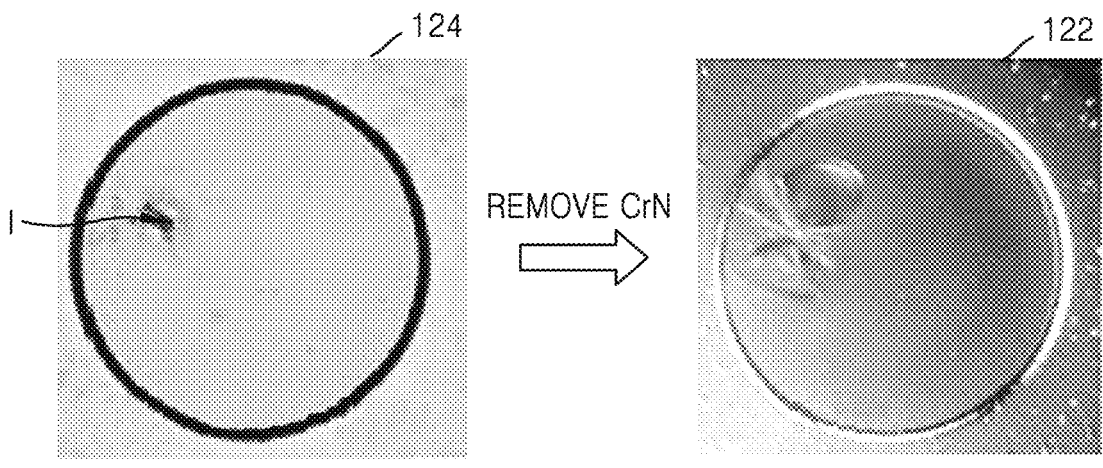

FIGS. 3A and 3B are a partial cross-sectional view of a wafer table and photographs corresponding thereto, for illustrating degradation of the wafer table. The photographs in FIG. 3B are plan views of one burl of a wafer table 120, the left photograph is a plan view of one burl of the wafer table 120 in which a chromium nitride (CrN) layer 124 is coated on a glass body 122, and the right photograph is a plan view of one burl of the wafer table 120 from which the chromium nitride (CrN) layer 124 is removed.

Referring to FIGS. 3A and 3B, the wafer table 120 may include the glass body 122 and the chromium nitride (CrN) layer 124. The chromium nitride (CrN) layer 124 may be thinly coated on the glass body 122 to a thickness of several tens to hundreds of micrometers (μm). The wafer table 120 may include on a top surface thereof a plurality of cylindrical protrusions referred to as burls B. The chromium nitride (CrN) layer 124 may cover a top surface and a side surface of the burl B, and a top surface of the glass body 122 between the burls B.

In an exposure process, an EUV exposure process, a wafer W may be loaded on the wafer table 120. For example, a frontside of the wafer W, which is subject to the exposure process, faces upwards, and a backside of the wafer W, which is the opposite side, may be in contact with the wafer table 120. A portion of the wafer table 120 in contact with the backside of the wafer W may correspond to, for example, top surfaces of the burls B of the wafer table 120. Meanwhile, in other processes, materials fixed to the backside of the wafer W, e.g., fine particles P, may damage a surface of the wafer table 120 due to continuous contact with the wafer table 120 as shown in FIG. 3A. The damage to the surface of the wafer table 120 may include, for example, an indentation (I) of the chromium nitride (CrN) layer 124, a groove or a crack C in the glass body 122, and/or the like. The damage to the surface of the wafer table 120 may be directly associated with degradation of an overlay which is a significant index in the exposure process.

Figure 4:
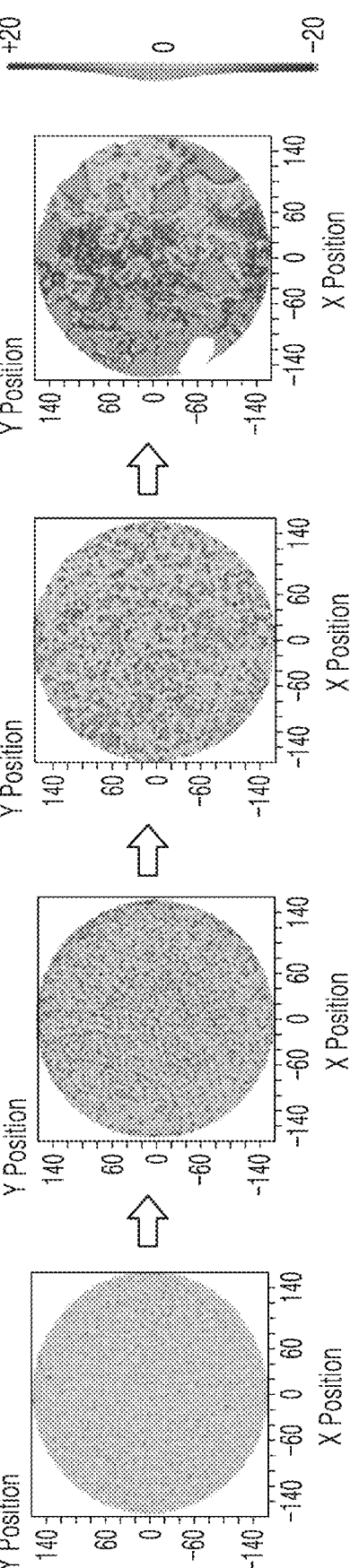
FIG. 4 shows simulation photographs of a height map of a wafer table illustrating a process of degradation of the wafer table.
Figure 5:
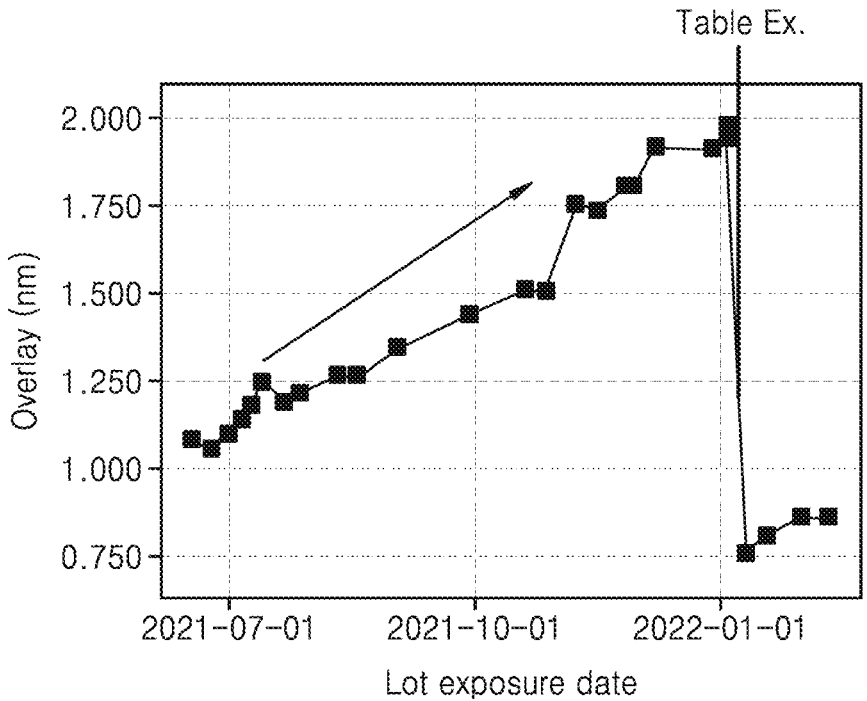
FIG. 5 is a graph illustrating a tendency of an overlay due to time-series degradation of a wafer table.
Figure 6:
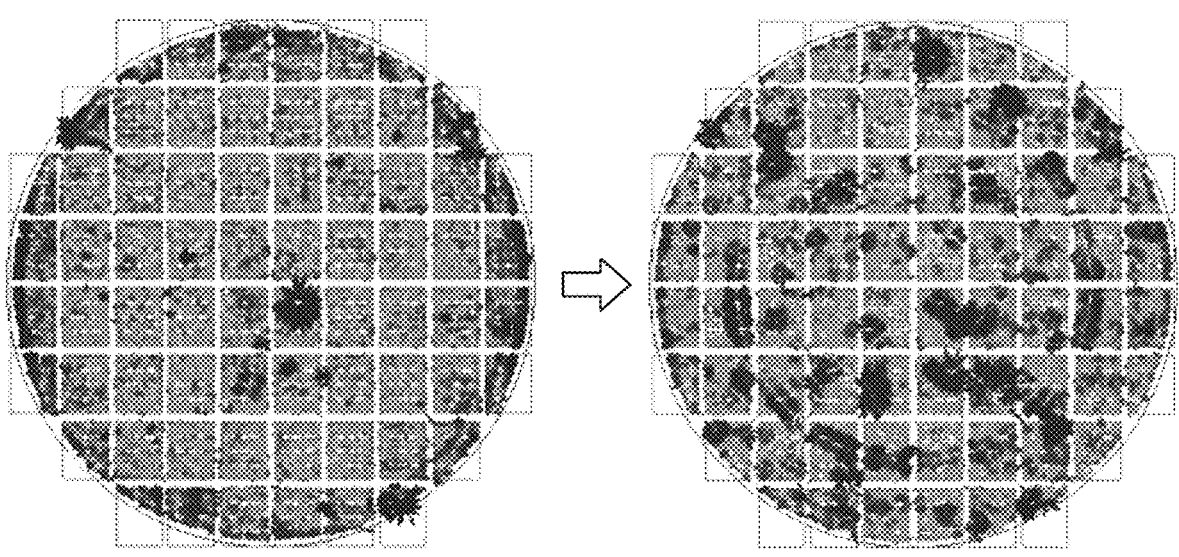
FIG. 6 shows simulation photographs of an overlay map illustrating an overlay due to time-series degradation of a wafer table.

FIG. 4 is simulation photographs of a height map of a wafer table illustrating a degradation process of the wafer table, FIG. 5 is a graph illustrating a tendency of an overlay due to time-series degradation of a wafer table, and FIG. 6 is simulation photographs of an overlay map illustrating an overlay due to time-series degradation of a wafer table. In FIG. 4, an x axis and a y axis represent positions, and a unit is mm. In FIG. 5, an x axis represents an exposure process date of a lot, and a y axis represents an average overlay of the lot.

Referring to FIG. 4, a height map of a wafer table is arranged in chronological order from the left. In the height map of the wafer table, a light gray portion may represent a reference height and may correspond to a normal state of the wafer table. Meanwhile, a portion, which becomes darker, may represent a portion higher or lower than the reference height and may correspond to an abnormal state of the wafer table. Meanwhile, the height map of the wafer table may be obtained by disposing a wafer on the wafer table and measuring a level of a top surface of the wafer. Accordingly, as shown in the simulation photographs illustrated in FIG. 4, the height map of the wafer table may have a size and shape corresponding to the wafer.

As illustrated in FIG. 4, the number of darker portions may increase in the height map of the wafer table over time. The increase in the number of black portions may indicate that a state of the top surface of the wafer table degrades from a normal state to an abnormal state over time. For example, over time, the top surface of the wafer table may be damaged by foreign substances, such as particles, and thus, indentations may increase. Accordingly, a height of the top surface of the wafer table may not be uniform throughout and may vary according to positions.

Referring to FIG. 5, as indicated by an arrow in the graph, an overlay continues to increase over time. Meanwhile, when the wafer table is exchanged to a new wafer table as indicated with "Table Ex.", the overlay may be greatly reduced. Therefore, easy prediction may be made that the overlay increases due to degradation of a top surface of the wafer table.

Referring to FIG. 6, an overlay map on the left shows an overlay map for a wafer that undergoes an exposure process on an initial wafer table, and an overlay map on the right shows an overlay map for a wafer that undergoes an exposure process on a wafer table after a certain period of time elapses. Meanwhile, as in the height map for the wafer table described above, even in the overlay map, a light gray portion may correspond to a portion having no or small overlay, and a portion thickened to black may correspond to a portion having a large overlay. Meanwhile, rectangles indicated throughout the wafer correspond to shots of the exposure process. A shot may also be referred to as a field.

Referring to FIG. 6, black portions increase significantly in a right overlay map. The increase in the black portions shows that an overlay significantly increases in the right overlay map. Equal to the results of the graphs of FIGS. 4 and 5, the result of the graph of FIG. 6 may enable prediction that degradation of the wafer table occurs over time, and overlay increases due to the degradation of the wafer table.

Figure 7:
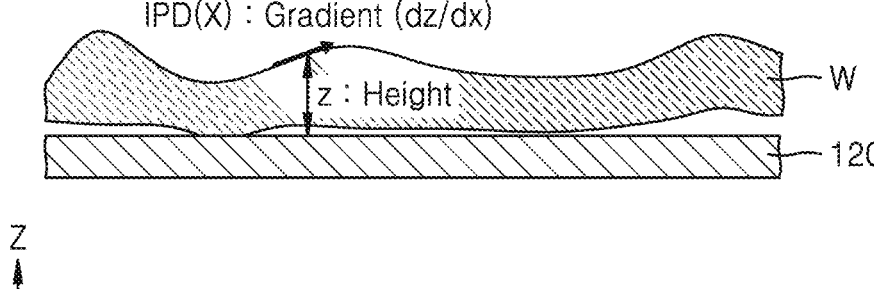
FIG. 7 is a conceptual diagram illustrating a process of converting leveling data into overlay data, in the overlay correction method of FIG. 1.

FIG. 7 is a conceptual diagram illustrating a process of converting leveling data into overlay data, in the overlay correction method of FIG. 1.

FIG. 7 illustrates a vertical cross section of a wafer table 120 and a wafer W loaded on the wafer table 120. As illustrated in FIG. 7, a top surface of the wafer W may have a curve due to degradation of a top surface of the wafer table 120. Accordingly, a level may be different for each position of the top surface of the wafer W. Here, the position may refer to a position on an X-Y plane, and the level may refer to a height in a Z direction. Before the wafer W is introduced into an exposure process, the wafer W is loaded on the wafer table 120, and the level may be measured for each position of the wafer W via the measurement apparatus 140. For example, a height z in the Z direction may be measured for each position of the wafer W via the measurement apparatus 140. Data regarding the height z in the Z direction for each position of the wafer W may correspond to leveling data regarding a wafer as described above.

Meanwhile, as indicated by an arrow on the top surface of the wafer W in FIG. 7, gradients may be obtained in an X direction and a Y direction at a position (x, y) at which the height z in the Z direction is measured. With respect to the height z in the Z direction, a gradient value dz/dx in the X direction and a gradient value dz/dy in the Y direction may correspond to IPD values ipdx and ipdy, respectively. For example, an x component ipdx of an IPD value may be calculated as dz/dx, and a y component ipdy of the IPD value may be calculated as dz/dy. As a result, the IPD values ipdx and ipdy may be calculated from the leveling data of the wafer W, i.e., the data regarding the height z in the Z direction. Subsequently, the IPD values ipdx and ipdy may be converted into overlay values w*ipdx and w*ipdy by multiplying the IPD values ipdx and ipdy by an appropriate weight w. The weight w may be set by considering a change in a width in the X direction or a change in a width in the Y direction according to a change in a height. In general, the change in the width in the X direction and the change in the width in the Y direction according to the change in the height are almost the same as each other, and thus, the weight w may have the same value with respect to the x component ipdx and the y component ipdy of the IPD value.

Figure 8A:
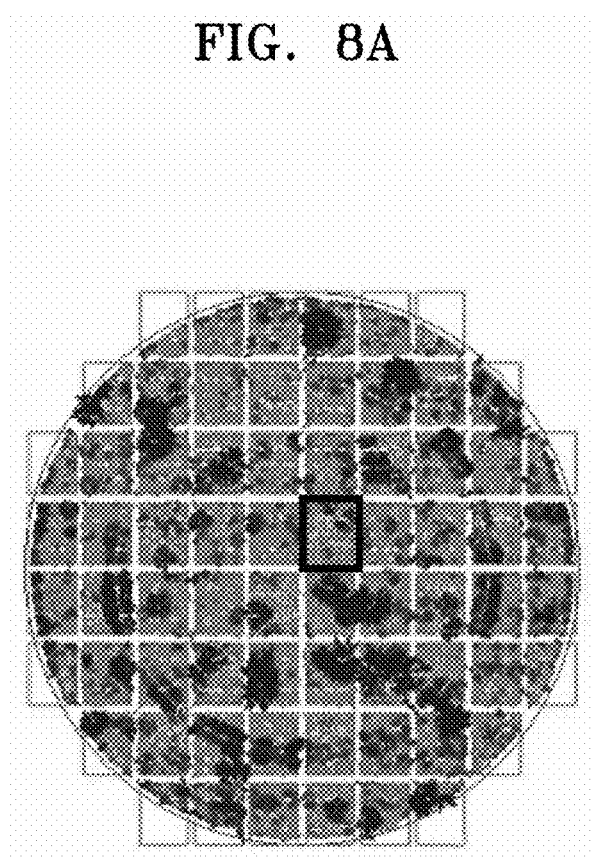
FIGS. 8A to 8D are conceptual diagrams illustrating a process of extracting a model for each sub-shot, in the overlay correction method of FIG. 1.
Figure 8B:
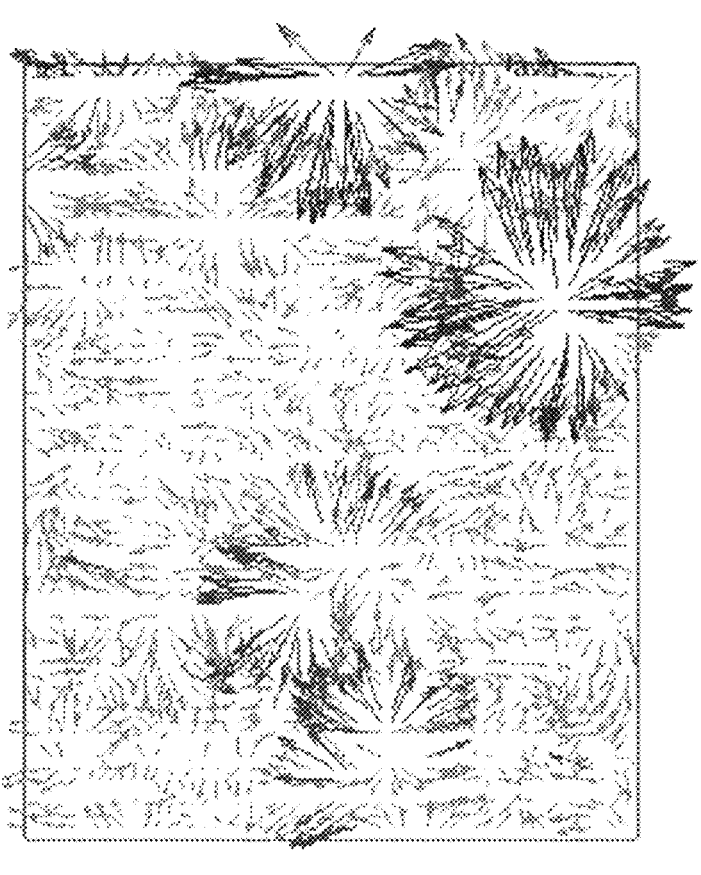
Figure 8C:
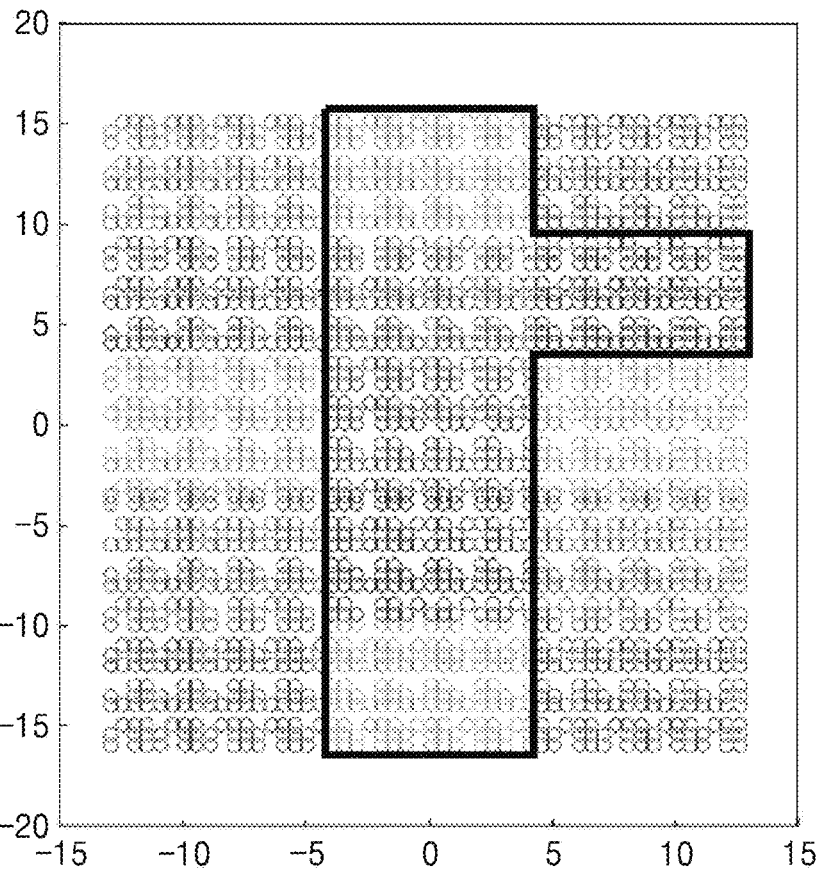
Figure 8D:
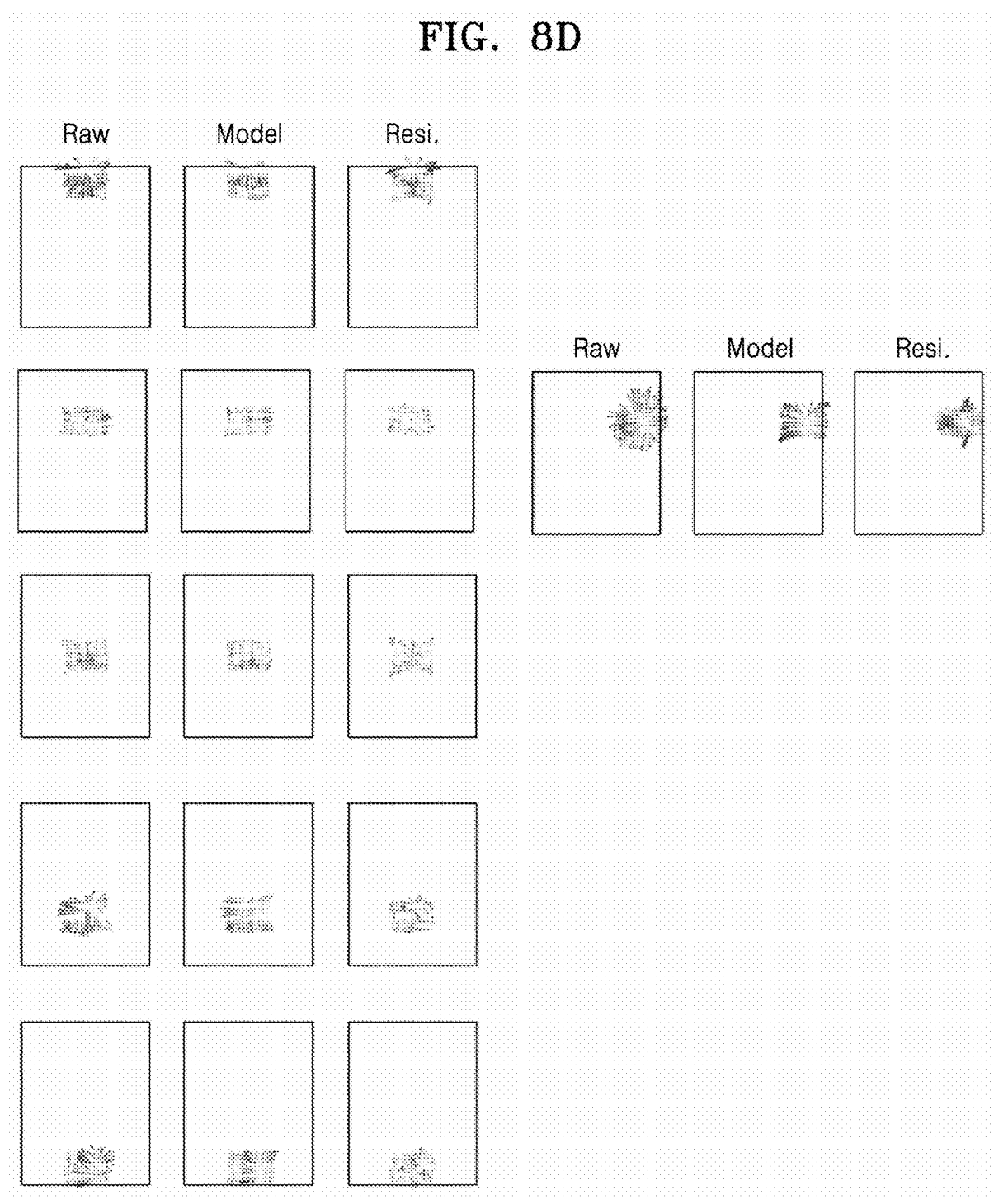

FIGS. 8A to 8D are conceptual diagrams illustrating a process of extracting a model for each sub-shot, in the overlay correction method of FIG. 1. FIG. 8A is a simulation photograph of an overlay map illustrating an overlay due to time-series degradation of a wafer table, and FIG. 8B illustrates an enlarged shot of a rectangular portion indicated by a thick black solid line in the overlay map of FIG. 8A. FIG. 8C conceptually illustrates a form in which the overlay map of FIG. 8B is split into sub-shots, and FIG. 8D is simulation photographs of raw overlay maps Law, model overlay maps Model, and residual overlay maps Resifor some of the sub-shots of FIG. 8C.

Referring to FIGS. 8A to 8D, the overlay map of FIGS. 8A and 8B shows an overlay that occurs due to degradation of a wafer table and is not corrected. The overlay of the overlay map of FIGS. 8A and 8B may correspond to a non-correctable error (NCE) overlay that may no longer be corrected because an overlay due to another cause is corrected. In the overlay correction method of the example embodiments, the overlay map of FIGS. 8A and 8B is treated as a raw overlay map. A 3 sigma value for the overlay map of FIG. 8A may appear to be about 1.36/1.25, and the overlay within a range of 99.7% may appear to be about 2.36/2.32. Here, a value before the "I" may indicate an overlay on an x axis, and a value after the "I" may indicate an overlay on a y-axis.

As illustrated in FIG. 8C, in the overlay correction method of the present example, one shot is split into 3*5 sub-shots. For example, one shot may be split into three regions in the X direction and five regions in the Y direction. However, the split form of sub-shots is not limited to the form of 3*5. Meanwhile, in FIG. 8C, the x axis and the y axis indicate positions of sub-shots in one shot, and a unit thereof may be millimeters (mm).

FIG. 8D illustrates raw overlay maps, model overlay maps, and residual overlay maps for sub-shots of a portion indicated by a thick solid line from among the sub-shots of FIG. 8C. As described above with reference to FIGS. 8A and 8B, the raw overlay map may refer to an overlay map in which an overlay due to degradation of the wafer table is not corrected. In addition, the model overlay map may refer to an overlay map showing a model extracted from overlay data (hereinafter, referred to as converted overlay data) converted from leveling data according to the overlay correction method of the example embodiments (e.g., a correctable overlay parameter). Meanwhile, the residual overlay map may correspond to an overlay map showing an overlay remaining after subtracting the model overlay map from the raw overlay map. Here, subtracting the model overlay map from the raw overlay map may indicate that an overlay of the raw overlay map is corrected by using an overlay parameter of the model overlay map. Accordingly, the residual overlay map may correspond to an overlay map after correcting the raw overlay map by using the model overlay map.

When the converted overlay data almost matches overlay data of the raw overlay map, an overlay of the residual overlay maps may be minimized. However, the converted overlay data, and the overlay data of the raw overlay map are basically different from each other. In addition, a correctable overlay parameter extracted from the converted overlay data may be further different from the overlay data of the raw overlay map. Accordingly, as illustrated in FIG. 8D, the overlay of the residual overlay map may remain with a certain size. However, the overlay of the residual overlay map may be greatly reduced compared to the overlay of the raw overlay map. For example, with respect to three sub-shots of FIG. 8D corresponding to a sub-shot (a portion protruding to the right as indicated by a thick solid line) at a position (3, 2) of FIG. 8C, in the raw overlay map, an overlay within a range of 99.7% appears to be 1.98/1.9, and in the residual overlay maps, an overlay within the range of 99.7% appears to be 0.94/1.1. Accordingly, the overlay may be greatly reduced.

Figure 9A:
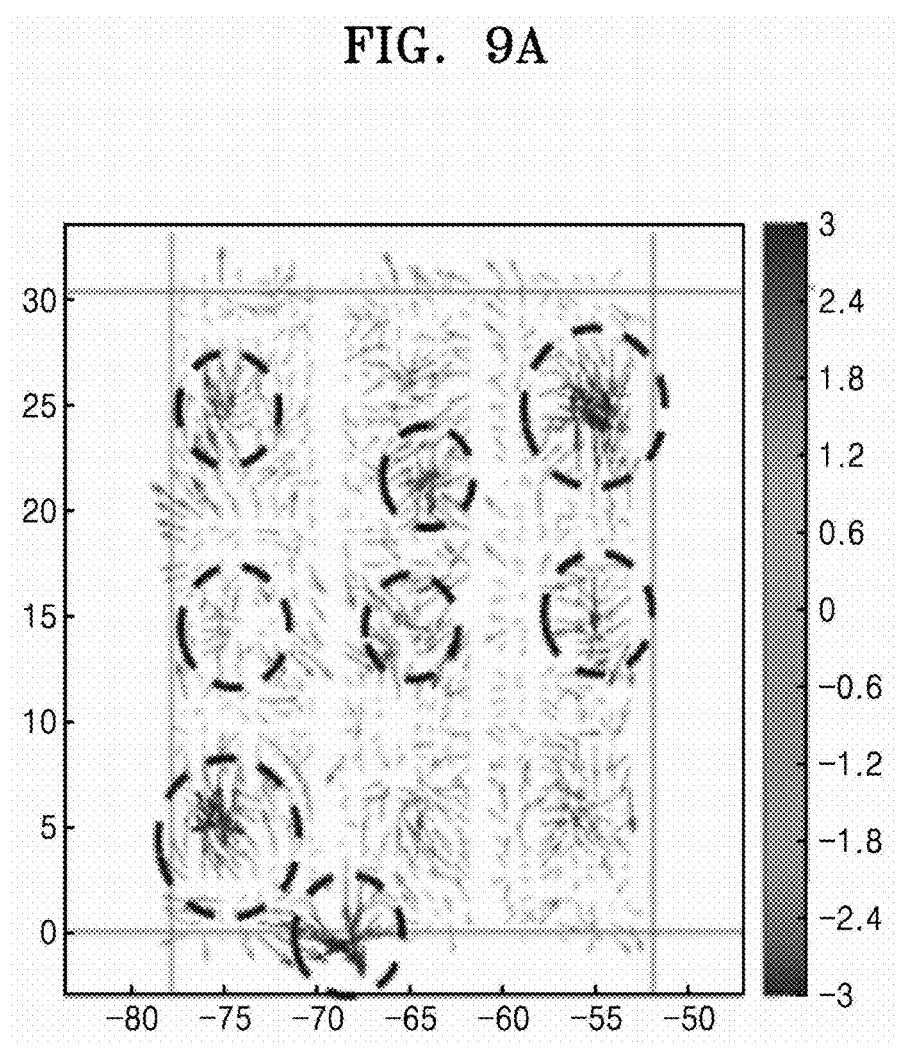
FIGS. 9A and 9B are graphs illustrating a correlation between a non-correctable error (NCE) overlay and an in-plane distortion (IPD) value.
Figure 9B:
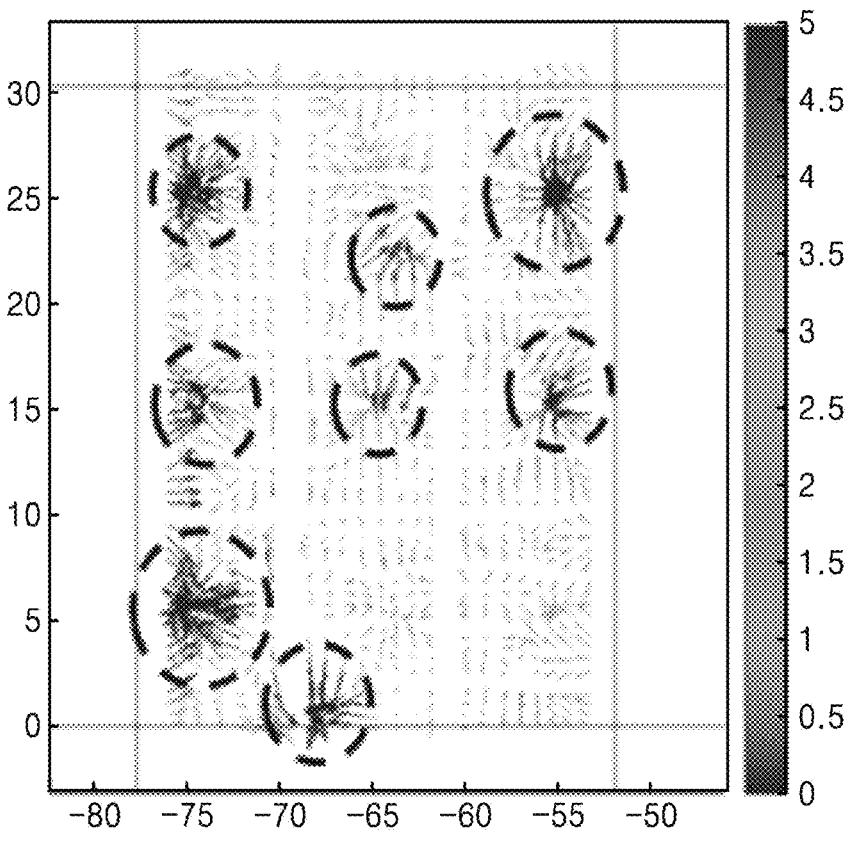

FIGS. 9A and 9B are graphs illustrating a correlation between a non-correctable error NCE overlay and an in-plane distortion (IPD) value for one shot. As illustrated in each of FIGS. 9A and 9B, an x axis and a y axis may represent a position for a corresponding shot, and a unit thereof may be mm.

Referring to FIGS. 9A and 9B, as described above, the NCE overlay indicates an overlay in which all overlays due to other causes are corrected, and only overlays due to degradation of a wafer table are not corrected. Meanwhile, as described above with reference to FIG. 7, an IPD value may be obtained by calculating a gradient value from leveling data. In addition, the IPD value may be converted into overlay data by applying an appropriate weight to the IPD value.

As illustrated in FIGS. 9A and 9B, the IPD value also appears great in a portion at which the NCE overlay appears great. Therefore, an overlay occupying a great proportion in the NCE overlay may be predicted to be due to the degradation of the wafer table.

Figure 10A:
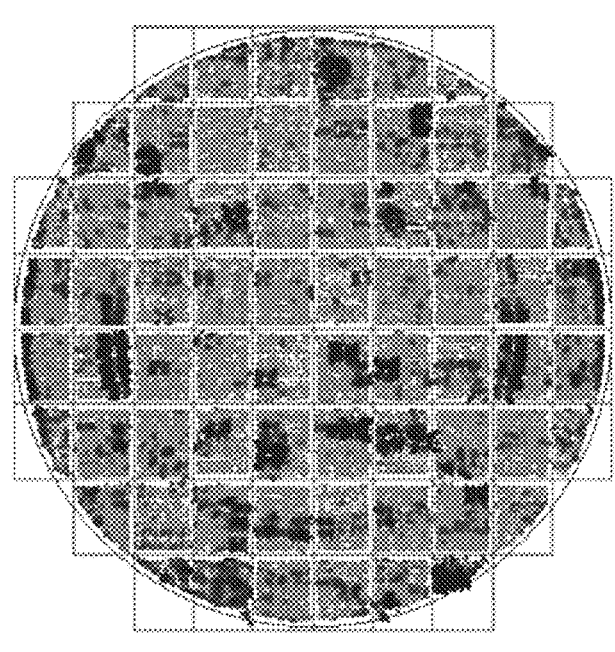
FIGS. 10A and 10B are simulation photographs of an overlay correction model for the entire wafer acquired via the overlay correction method of FIG. 1 and of an overlay map after correction using the overlay correction model.
Figure 10B:
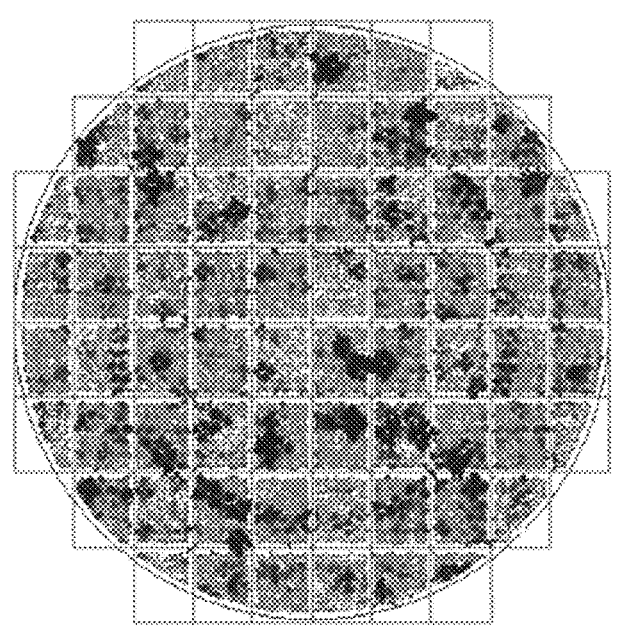

FIGS. 10A and 10B are simulation photographs of an overlay correction model for the entire wafer acquired by the overlay correction method of FIG. 1, and an overlay map after correction using the overlay correction model.

Referring to FIGS. 10A and 10B, the overlay correction model of FIG. 10A may appear with a value obtained by obtaining converted overlay data on the basis of leveling data of a wafer, and extracting a model (e.g., a correctable overlay parameter) from the converted overlay data. The overlay correction model shows an overlay to be corrected, and thus may have a similar value to an overlay of a raw overlay map as described above. However, as described above, processes of acquiring overlay data of the raw overlay map and the converted overlay data may be different from each other, and may be further different from each other in a model extraction process. Therefore, an overlay of the overlay correction model may be different from an overlay of the raw overlay map. For example, in the overlay correction model, a 3 sigma value may appear to be 1.12/0.98, and an overlay within a range of 99.7% may appear to be about 1.88/1.49. Therefore, the overlay of the overlay correction model may appear to be smaller than the overlay of the raw overlay map.

Meanwhile, the overlay map of FIG. 10B after correction using the overlay correction model shows a relatively small overlay. For example, in the overlay map after correction using the overlay correction model, a 3 sigma value may appear to be 0.78/0.79, and an overlay within a range of 99.7% range may appear to be 1.28/1.39. Compared to the overlay of the raw overlay map, an overlay on an x axis may be changed from 2.36 to 1.28, and thus may be reduced by 1.08 to be improved by 46%, and an overlay on a y axis may be changed from 2.32 to 1.39, and thus may be reduced by 0.93 to be improved by 40%.

Figure 11:
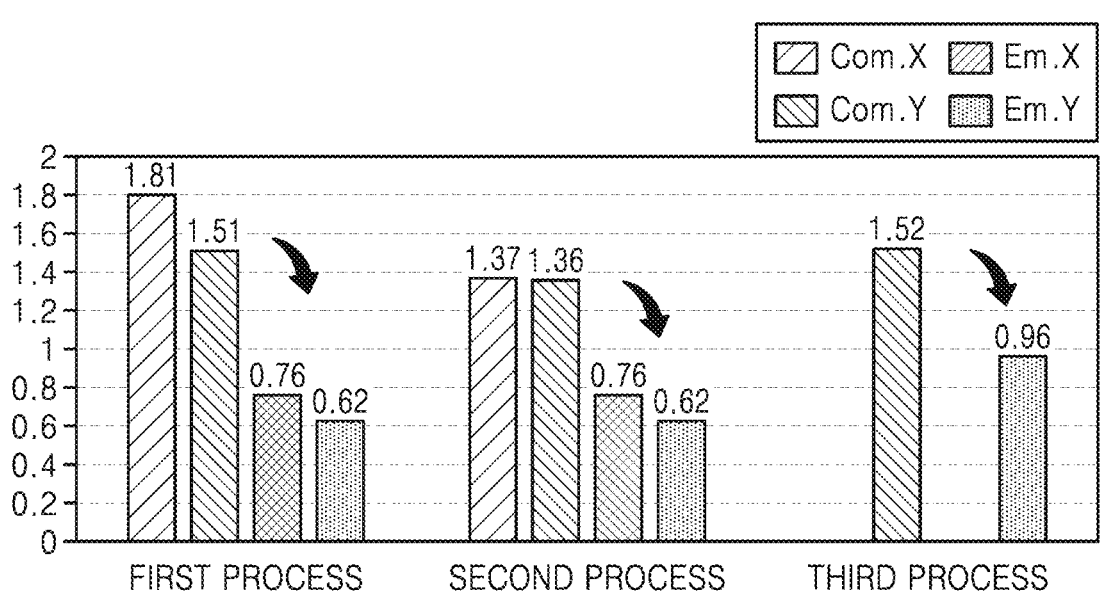
FIG. 11 is a graph illustrating an overlay in various processes, according to an overlay correction method of a comparative example and the overlay correction method of FIG. 1.

FIG. 11 is a graph illustrating an overlay in various processes, according to an overlay correction method of a comparative example and the overlay correction method of FIG. 1. An x axis may represent a process number, a y axis may represent an overlay, and a unit may be nanometers (nm). In FIG. 11, Com.X represents an x-axis overlay of the comparative example, and Com.Y represents a y-axis overlay of the comparative example. In addition, Em.X represents an x-axis overlay of the example embodiments, and Em.Y represents a y-axis overlay of the example embodiments.

Referring to FIG. 11, all of first to third processes show that an overlay is greatly reduced by applying the overlay correction method of the example embodiments. For example, in the first process, the overlay may appear to be 1.81/1.51 in the correction method of the comparative example, and may appear to be 0.76/062 in the overlay correction method of the example embodiments. In the second process, the overlay may appear to be 1.37/1.36 in the overlay correction method of the comparative example, and may appear to be 0.76/0.62 in the overlay correction method of the example embodiments. In addition, in the third process, the overlay may appear to be 1.52 in the overlay correction method of the comparative example, and may appear to be 0.96 in the overlay correction method of the example embodiments. Meanwhile, in the third process, only the x-axis overlay may be measured due to process characteristics.

From the results of FIG. 11, compared to the overlay correction method of the comparative example, the overlay correction method of the present example may improve the overlay by at least about 0.5 nm.

Figure 12:
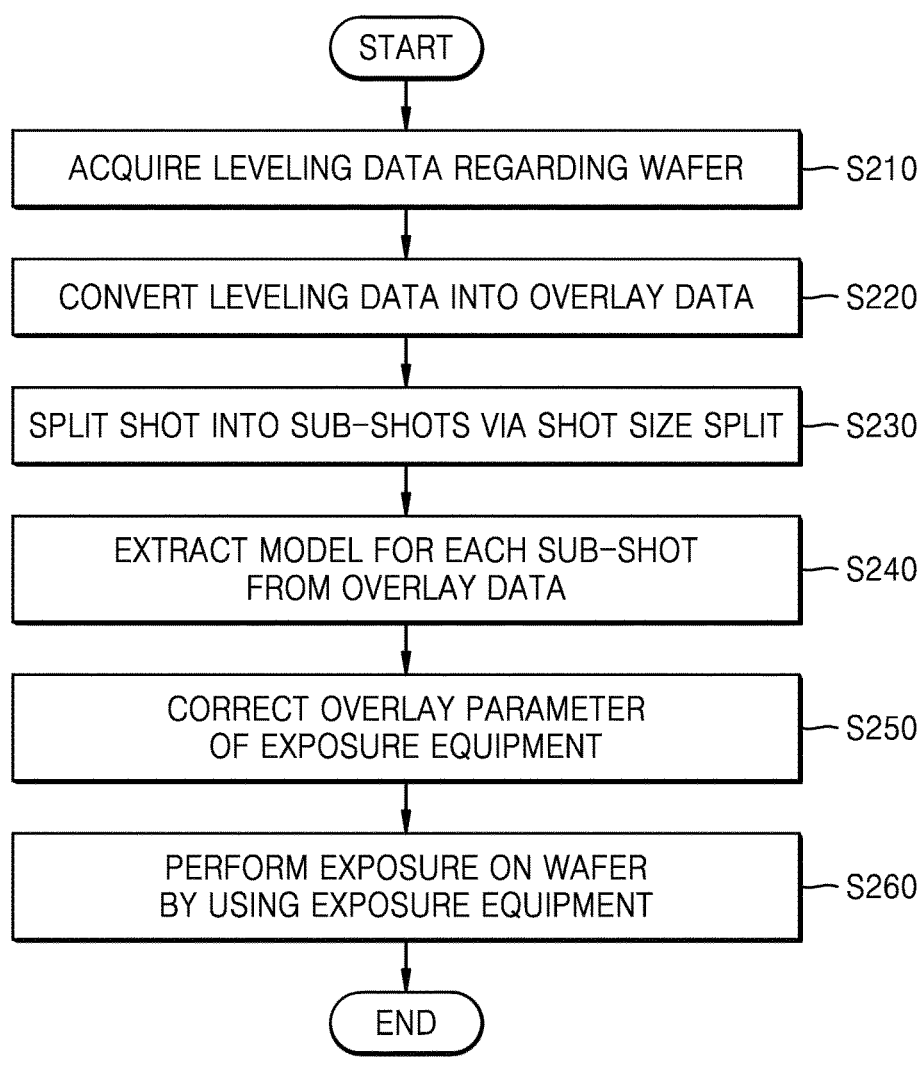
FIG. 12 is a flowchart schematically illustrating a process of an exposure method including an overlay correction method, according to at least one embodiment.

FIG. 12 is a flowchart schematically illustrating a process of an exposure method including an overlay correction method, according to at least one embodiment. The description of FIG. 12 will be given with reference to FIG. 2 together, and the same description thereof as that of FIGS. 1 to 11 will be briefly described or omitted herein.

Referring to FIG. 12, the exposure method of the present example including an overlay correction method (hereinafter, simply referred to as an exposure method) performs sequentially operation S210 of acquiring leveling data regarding a wafer to operation S250 of correcting an overlay parameter of exposure equipment. The descriptions of operation S210 of acquiring the leveling data regarding the wafer to operation S250 of correcting the overlay parameter of the exposure equipment are the same as, and/or substantially similar to, the descriptions of operation S110 of acquiring the leveling data regarding the wafer to operation S150 of correcting the overlay parameter of the exposure equipment, in the overlay correction method of FIG. 1. Therefore, repeat descriptions thereof have been omitted.

After correcting the overlay parameter of the exposure equipment, in operation S260, exposure is performed on the wafer by using the exposure equipment. The exposure equipment may be, for example, EUV exposure equipment. However, the exposure equipment is not limited to the EUV exposure equipment. In the exposure method of the example embodiments, exposure may be performed on the wafer while correcting in real time an overlay parameter in a feedforward method by using the leveling data regarding the wafer, and two wafer tables (120-1 and 120-2).

When described in more detail with reference to the EUV exposure equipment 100 of FIG. 2, leveling data may be acquired for the first wafer W1 on the first wafer table 120-1 via the measurement apparatus 140, and an exposure process may be performed on the second wafer W2 on the second wafer table 120-2. Subsequently, in relation to the leveling data of the first wafer W1, conversion into overlay data and extraction of a model for each sub-shot may be performed. In addition, apart from the exposure process for the second wafer W2, an overlay parameter of the EUV exposure equipment 100 may be corrected before the first wafer W1 is introduced into an exposure process.

Meanwhile, after the exposure process for the second wafer W2 is completed, the second wafer W2 may be unloaded and taken out from the second wafer table 120-2, and positions of the first wafer table 120-1 and the second wafer table 120-2 may be swapped with each other. Subsequently, an exposure process may be performed on the first wafer W1 on the first wafer table 120-1 via the EUV optical system 110 of the EUV exposure equipment 100 having the corrected overlay parameter. As described above, the method of correcting the overlay parameter of the EUV exposure equipment 100 on the basis of the leveling data acquired from the first wafer W1 and performing the exposure process on the first wafer W1 via the EUV exposure equipment 100 having the corrected overlay parameter may correspond to a feedforward method. Meanwhile, processes of loading a new wafer on the second wafer table 120-2 and acquiring leveling data via the measurement apparatus 140 may be performed. A series of processes described above may be repeatedly performed on all wafers of one lot.

In addition, in operation S260 of performing exposure on the wafer, when an EUV exposure process is performed on the wafer, EUV light may be incident on the EUV mask in a curved slit form via the first optical system, and the EUV light reflected from the EUV mask may be irradiated via the second optical system onto the wafer W to be exposed. Here, the EUV light may be projected onto a PR layer on the wafer. Meanwhile, the EUV exposure process for the wafer may include forming a PR pattern by performing a development process, a cleaning process, and the like on the PR layer.

Figure 13:
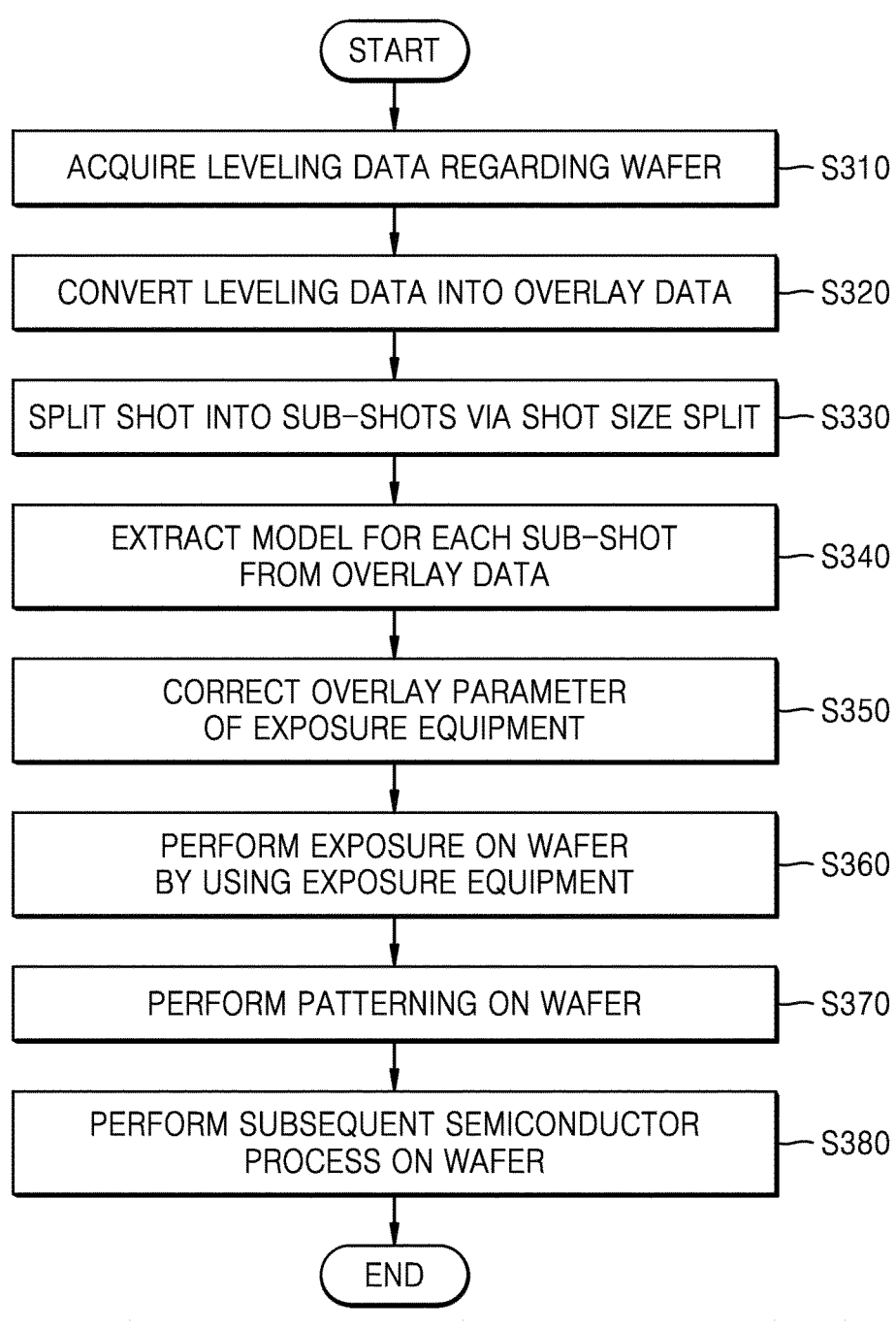
FIG. 13 is a flowchart schematically illustrating a process of a semiconductor device manufacturing method including an overlay correction method, according to at least one embodiment.

FIG. 13 is a flowchart schematically illustrating a process of a semiconductor device manufacturing method including an overlay correction method, according to at least one embodiment. The description of FIG. 13 will be given with reference to FIG. 2 together, and the same description thereof as that of FIG. 12 will be briefly described or omitted herein.

Referring to FIG. 13, a semiconductor device manufacturing method including an overlay correction method, according to at least one embodiment (hereinafter, simply referred to as a semiconductor device manufacturing method), performs sequentially operation S310 of acquiring leveling data regarding a wafer to operation S350 of correcting an overlay parameter of exposure equipment. The descriptions of operation S310 of acquiring the leveling data regarding the wafer to operation S350 of correcting the overlay parameter of the exposure equipment are the same as, and/or substantially similar to, the descriptions of operation S110 of acquiring the leveling data regarding the wafer to operation S150 of correcting the overlay parameter of the exposure equipment, in the overlay correction method of FIG. 1. Therefore, repeat descriptions thereof have been omitted.

Subsequently, in operation S360, exposure is performed on the wafer by using the exposure equipment. The description of operation S360 of performing the exposure on the wafer is the same as, and/or substantially similar to, the description of operation S260 of performing the exposure on the wafer, in the exposure method of FIG. 12. In the semiconductor device manufacturing method of the present example, an exposure process may be an EUV exposure process. However, the exposure process is not limited to the EUV exposure process.

After the exposure process for the wafer, in operation S370, patterning is performed on the wafer. The patterning on the wafer may refer to a process of forming a pattern on the wafer via an etching process by using a PR pattern as a mask. The pattern on the wafer may be an absorption layer pattern of an EUV mask that is transferred to the wafer via an exposure process and an etching process.

Subsequently, in operation S380, a subsequent semiconductor process is performed on the wafer. The subsequent semiconductor process may include various processes. For example, the subsequent semiconductor process may include a deposition process, an etching process, an ion process, a cleaning process, and/or the like. In addition, the subsequent semiconductor process may include a singulation process of individualizing the wafer into individual semiconductor chips, a test process for testing the semiconductor chips, and a packaging process for packaging the semiconductor chips. A semiconductor device may be completed via the subsequent semiconductor process for the wafer.

While the inventive concepts have been particularly shown and described with reference to embodiments thereof, it will be understood that various changes in form and details may be made therein without departing from the spirit and scope of the following claims.

What is claimed is:

1. An overlay correction method comprising:

acquiring leveling data of a wafer;

converting the leveling data into overlay data;

splitting a shot of the wafer into sub-shots via a shot size split;

generating a plurality of models by extracting a model for each of the sub-shots from a corresponding portion of the overlay data; and correcting an overlay parameter of exposure equipment based on at least one of the plurality of models, wherein the correcting of the overlay parameter is applied in real time to an exposure process for the wafer, wherein the shot size split corresponds to a division of the shot of the wafer into the sub-shots of the same size without overlapping with each other.

2. The overlay correction method of claim 1, wherein the correcting of the overlay parameter is performed before the exposure process for the wafer, and the exposure process for the wafer uses the corrected overlay parameter.

3. The overlay correction method of claim 1, wherein the leveling data includes a value representing a vertical direction with respect to the wafer, and the converting into the overlay data includes calculating an in-plane distortion (IPD) value from the value representing the vertical direction, and converting the IPD value into the overlay data.

4. The overlay correction method of claim 3, wherein the overlay data includes, on a plane perpendicular to the vertical direction, a component in a first direction and a component in a second direction perpendicular to the first direction, the IPD value is calculated based on at least one of a gradient value in the first direction and a gradient value in the second direction with respect to the value in the vertical direction, and the IPD value is converted into the overlay data by applying a weight to the IPD value.

5. The overlay correction method of claim 1, wherein the splitting the shot into the sub-shots includes at least one of the sub-shots having a size selected to reflect an indentation of a wafer table, the generating the plurality of models includes the plurality of models indicating correctable values.

6. The overlay correction method of claim 5, wherein splitting into the sub-shots includes splitting the shot into 3*5 sub-shots.

7. The overlay correction method of claim 1, wherein the exposure equipment includes first and second wafer tables, the acquiring the leveling data includes acquiring first leveling data by performing a level measurement on a first wafer corresponding to the wafer on the first wafer table, the exposure process includes performing a first exposure process on a second wafer, on the second wafer table, and wherein the method further comprises after the exposure process for the second wafer, unloading the second wafer from the second wafer table;

swapping positions of the first and second wafer tables;

performing a second exposure process on the first wafer on the first wafer table; and acquiring second leveling data by loading a third wafer on the second wafer table and performing level measurement, and wherein the overlay parameter corrected based on the first leveling data is used in the second exposure process for the first wafer.

8. The overlay correction method of claim 1, wherein the wafer is included in a plurality of wafers, and the correcting the overlay parameter corrects the overlay parameter for each of the plurality of wafers and each of the sub-shots in real time and the corrected overlay parameter is used in the exposure process.

9. The overlay correction method of claim 1, wherein the leveling data reflects a state of a top surface of a wafer table having the wafer loaded thereon in time series, and the correcting the overlay parameter includes correcting an overlay due to time-series degradation of the top surface of the wafer table.

10. An exposure method comprising:

acquiring first leveling data of a first wafer;

converting the first leveling data into overlay data;

splitting a shot of the first wafer into sub-shots via a shot size split;

generating a plurality of models by extracting a model for each of the sub-shots from a corresponding portion of the overlay data;

correcting an overlay parameter of exposure equipment based on at least one of the plurality of models; and performing an exposure process on the first wafer using the exposure equipment adjusted based on the corrected overlay parameter, wherein the shot size split corresponds to a division of the shot of the wafer into the sub-shots of the same size without overlapping with each other.

11. The exposure method of claim 10, wherein the first leveling data includes a value representing a vertical direction with respect to the first wafer, and the converting the first leveling data into the overlay data includes calculating an in-plane distortion (IPD) value from the value in the vertical direction, and converting the IPD value into the overlay data.

12. The exposure method of claim 10, wherein the splitting the shot into the sub-shots includes at least one of the sub-shots having a size selected to reflect an indentation of a wafer table, and the generating of the plurality of models includes the plurality of models indicating correctable values.

13. The exposure method of claim 10, wherein the exposure equipment includes first and second wafer tables, the first leveling data regarding the first wafer is acquired from the first wafer table, an exposure process for a second wafer is performed on the second wafer table, the performing the exposure process on the first wafer is performed on the first wafer table and the corrected overlay parameter is corrected based on the first leveling data, and wherein the method further comprises after the exposure process for the second wafer, unloading the second wafer from the second wafer table; swapping positions of the first and second wafer tables; and loading a third wafer on the second wafer table and performing a level measurement on the third wafer.

14. The exposure method of claim 10, wherein
the first wafer is included in a plurality of wafers, and
the exposure process is performed by correcting the
overlay parameter for each of the plurality of wafers
and each of the sub-shots in real time.

15. The exposure method of claim 10, wherein the exposure process uses an extreme ultra-violet (EUV) light.

16. A semiconductor device manufacturing method comprising:
acquiring leveling data of at least one of a plurality of wafers;
converting the leveling data into overlay data;
splitting a shot of the at least one wafer into sub-shots via a shot size split;
generating a plurality of models by extracting a model for each of the sub-shots from a portion of the overlay data;
correcting an overlay parameter of exposure equipment on based on at least one of the plurality of models;
performing an exposure process on the at least one wafer using the exposure equipment adjusted based on the corrected overlay parameter;
patterning the at least one exposed wafer; and
performing a subsequent semiconductor process on the at least one patterned wafer,
wherein the exposure process is performed by correcting the overlay parameter for each of the plurality of wafers and each sub-shot in real time, and
wherein the shot size split corresponds to a division of the shot of the wafer into the sub-shots of the same size without overlapping with each other.

17. The semiconductor device manufacturing method of claim 16, wherein
the leveling data includes a value representing a vertical direction with respect to the at least one wafer, and
the converting into the overlay data includes
calculating an in-plane distortion (IPD) value from the value representing the vertical direction, and
converting the IPD value into the overlay data.

18. The semiconductor device manufacturing method of claim 16, wherein
the splitting the shot into the sub-shots includes at least one of the sub-shots having a size selected to of reflect an indentation of a wafer table, and
the generating the plurality of models includes the plurality of models indicating correctable values.

19. The semiconductor device manufacturing method of claim 16, wherein
the exposure equipment includes first and second wafer tables,
first leveling data corresponding to the leveling data is acquired by performing a level measurement on a first wafer, of the plurality of wafers, on the first wafer table, and
the exposure process for a second wafer, of the plurality of wafers, is performed on the second wafer table,
wherein the method further comprises
after the exposure process for the second wafer, unloading the second wafer;
swapping positions of the first and second wafer tables;
performing the exposure process for the first wafer on the first wafer table using the corrected overlay parameter corrected based on the first level data; and
loading a third wafer, of the plurality of wafers, on the second wafer table and performing the level measurement on the third wafer.

20. The semiconductor device manufacturing method of claim 16, wherein the exposure process uses an extreme ultraviolet (EUV) light, and the correcting the overlay parameter includes correcting an overlay due to time-series degradation of a top surface of a wafer table having the at least one wafer loaded thereon.

* * * * *